(12) United States Patent
Morel et al.

(10) Patent No.: US 9,031,106 B2
(45) Date of Patent: May 12, 2015

(54) HYPERBOLIC METAMATERIALS AS DISTRIBUTED BRAGG MIRRORS FOR HIGH POWER VCSEL DEVICES

(71) Applicant: BAE Systems Information and Electronic Systems Integration Inc., Nashua, NH (US)

(72) Inventors: Yannick C. Morel, Falls Church, VA (US); Igor I. Smolyaninov, Columbia, MD (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/453,712

(22) Filed: Aug. 7, 2014

(65) Prior Publication Data

US 2014/0348191 A1    Nov. 27, 2014

Related U.S. Application Data

(62) Division of application No. 13/604,713, filed on Sep. 6, 2012, now Pat. No. 8,831,058.

(51) Int. Cl.
*H01S 3/04* (2006.01)
*H01S 5/024* (2006.01)
*B82Y 20/00* (2011.01)
*G02B 1/00* (2006.01)
*H01S 5/183* (2006.01)
*H01S 5/187* (2006.01)

(52) U.S. Cl.
CPC ....... *H01S 5/02476* (2013.01); *Y10T 29/49826* (2015.01); *B82Y 20/00* (2013.01); *G02B 1/002* (2013.01); *H01S 5/18377* (2013.01); *H01S 5/18361* (2013.01); *H01S 5/187* (2013.01)

(58) Field of Classification Search
USPC .................... 372/34, 43.01, 45.011, 50.11
See application file for complete search history.

(56) References Cited

U.S. PATENT DOCUMENTS

| | | |
|---|---|---|
| 2004/0264530 A1 | 12/2004 | Ryou et al. |
| 2007/0267406 A1 | 11/2007 | Thimm |
| 2008/0180786 A1 | 7/2008 | Bratkovski |
| 2012/0019432 A1 | 1/2012 | Bowers et al. |
| 2012/0288627 A1 | 11/2012 | Hodges et al. |
| 2013/0340990 A1 | 12/2013 | Smolyaninov et al. |

*Primary Examiner* — Dung Nguyen
(74) *Attorney, Agent, or Firm* — Daniel J. Long

(57) ABSTRACT

Implementing a layered hyperbolic metamaterial in a vertical cavity surface emitting laser (VCSEL) to improve thermal conductivity and thermal dissipation thereby stabilizing optical performance. Improvement in the thermal management and power is expected by replacing the distributed Bragg reflector (DBR) mirrors in the VCSEL. The layered metamaterial structure performs the dual function of the DBR and the heat spreader at the same time.

7 Claims, 3 Drawing Sheets

HYPERBOLIC METAMATERIALS AS DISTRIBUTED BRAGG MIRRORS FOR HIGH POWER VCSEL DEVICES

CROSS-REFERENCE TO RELATED APPLICATIONS

This Application is a divisional of U.S. application Ser. No. 13/604,713 filed Sep. 6, 2012, the contents of which are incorporated herein by reference.

FIELD OF THE INVENTION

The present invention relates to advanced vertical cavity surface-emitting lasers (VCSEL) devices for the pumping of solid state lasers. More particularly, the present invention improves the thermal management of high power VCSEL arrays used for pumping solid state lasers and amplifiers.

BRIEF DESCRIPTION OF PRIOR DEVELOPMENTS

Solid state lasers are commonly used in many applications, such as directed energy technologies. In these applications, the lasers are often limited by the performances of the pump source and, more particularly, its thermal management (the optical power of the pump source, such as a laser diode or a VCSEL array, is primarily limited by the thermal load of the device). For instance, current GaAs/AGaAs distributed Bragg reflectors (DBRs) have a low thermal conductivity of approximately 0.2 W/cmK. Additionally, the emission wavelength of the device is strongly linked to its operating temperature. The DBR structure currently used in high power VCSEL devices is the main limitation in the thermal management of a device due to its low thermal conductivity.

A need, therefore exists, for a VCSEL system with improved thermal management and heat dissipation.

SUMMARY OF THE INVENTION

The present invention uses hyperbolic metamaterials in a layered structure to replace the conventional DBRs that are commonly used in VCSEL design and construction. This enables improved thermal management of high power VCSEL arrays for pumping solid state lasers and amplifiers. In the proposed approach, the metamaterial structure is expected to provide 100 times better thermal conductivity than that of DBRs, which would enable significant improvement in the VCSEL array performance and reliability. This is due to the broadband divergence of photonic density of states and greatly benefits the solid state lasers and amplifiers pumped by such VCSEL arrays.

Compared to laser diodes, VCSEL arrays provide several benefits relating to pumping applications. For example, the low wavelength dependence with temperature, power scalability with geometry and low beam divergence have proved useful in improving the reliability of solid state lasers while reducing its weight and complexity. Another benefit of this approach over traditional methods is that the heat spreader is as close as possible to the heat source, in this case the active region of the VCSEL.

BRIEF DESCRIPTION OF THE DRAWINGS

The present invention is further described with reference to the accompanying drawings wherein.

DETAILED DESCRIPTION OF THE PREFERRED EMBODIMENT

In the present invention hyperbolic metamaterials are implemented in a layered structure in VCSEL design and construction. These materials are extremely anisotropic, being metallic ($\in<0$) in one direction, while dielectric ($\in>0$) in the orthogonal direction—such anisotropy leading to the opening of the photonic density of sates (DOS), and the surface of constant frequency becomes open in a select space k. The wave equation describing a hyperbolic metamaterial is as follows:

$$-\frac{\omega^2}{c^2}\varphi_\omega = \frac{\partial^2 \varphi_\omega}{\varepsilon_1 \partial z^2} + \frac{1}{\varepsilon_2}\left(\frac{\partial^2 \varphi_\omega}{\partial x^2} + \frac{\partial^2 \varphi_\omega}{\partial y^2}\right)$$

where $\in_1$ and $\in_2$ have opposite signs, reducing to $$\frac{\omega^2}{c^2} = \frac{k_z^2}{\varepsilon_1} + \frac{k_{xy}^2}{\varepsilon_2}$$

Figure 1:
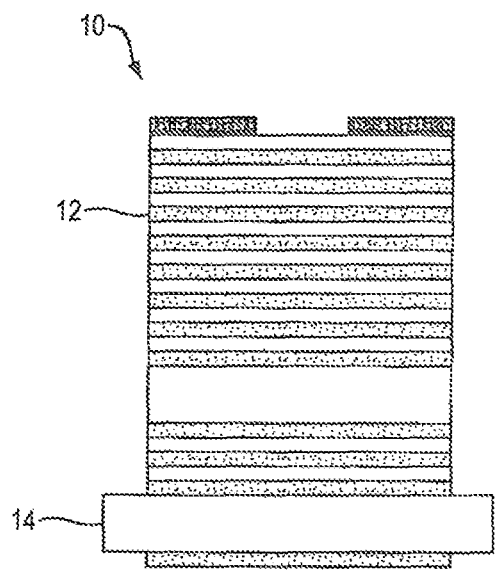
FIG. 1 shows the typical geometry of a prior art distributed Bragg mirror.

The layered hyperbolic metamaterial essentially replaces the commonly used DBR structure. The hyperbolic metamaterial functions similar to the way a DBR structure does, and acts as a highly efficient heat spreader. This is partly because of the geometric similarity in a DBR structure and a layered metamaterial. FIG. 1 depicts the geometry of a distributed Bragg mirror and quantum well structures found in a typical oxide-confined VCSEL 10. Layers 12 are comprised of either AlAs or AlGaAs. These layers 12 are typically 100 nm to less than 10 µm thick. The VCSEL 10 is supported by a substrate 14 such as an n-GaAs substrate.

Figure 2:
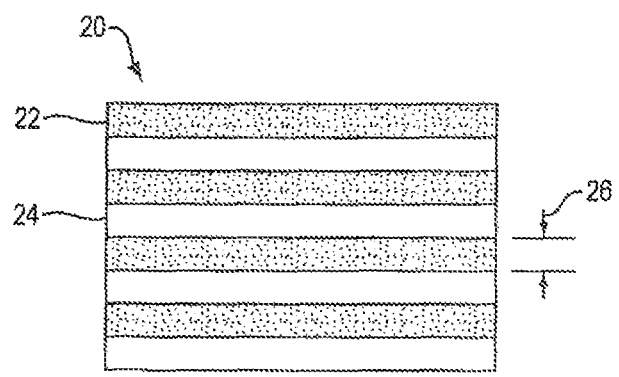
FIG. 2 shows the geometry of layered hyperbolic metamaterial.

The DBR is formed of alternating layers with respectively high and low indexes of refraction, while the metamaterial structure in FIG. 2 is formed of alternating layers with respectively positive 22 and negative 24 dielectric constants $\in$ in the long wave infrared range (LWIR). For both structures, the layers are of comparable thickness. The thickness 26 of the layers is less than 10 µm. These layered hyperbolic metamaterials may act as a DBR in the visible range, while having broadband hyperbolic behavior in the LWIR range. The comparable thickness of the two structures creates the possibility of a design with a combination of materials for each layer so that the structure works as a DBR for a specific wavelength and as a metamaterial structure with efficient heat transfer properties.

Figure 3A:
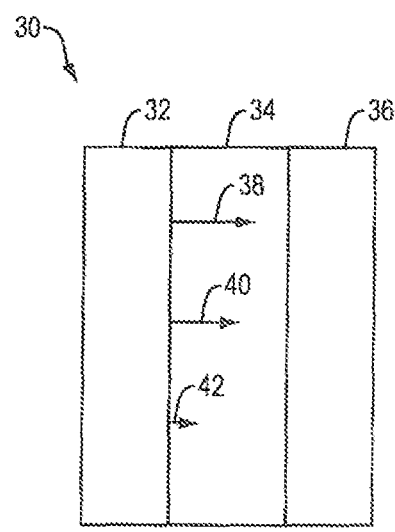
FIGS. 3A and 3B show the heat transfer for a metal/dielectric and a hyperbolic medium, respectively.
Figure 3B:
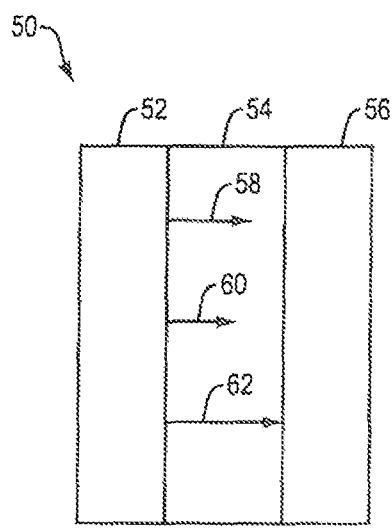

FIG. 3A shows the heat transfer of an ordinary metal/dielectric ("elliptic" material) 30 heat source 32 to a heat sink 34. As seen in the Figure, heat transfer is dominated by the electrons 38 and the phonons 40. Very little, if any, heat transfer is made by the photons 42. FIG. 3B, on the other hand, shows a hyperbolic metamaterial medium in which the heat transfer is dominated by the photons. However, FIG. 3B shows the heat transfer 50 from a heat source 52, through hyperbolic metamaterial 54, to a heat sink 56. Here, in addition to the heat transfer made by the electrons 58 and phonons 60, the heat transfer is dominated by the photons 62.

A reason for the novel phenomena of hyperbolic metamaterials is the broadband singular behavior of their density of photonic states. For instance, the broadband divergence of the photonic density of states leads to a substantial increase in radiative heat transfer compared to the Stefan-Boltzmann law observed in a vacuum and in dielectric materials. This radiative thermal "hyper-conductivity" may approach or even exceed heat conductivity via electrons and phonons, with the additional advantage of radiative heat transfer being much faster. This key characteristic is essential to the present invention. The enhanced photonic density of states in the hyperbolic metamaterials originates from the waves with high wave numbers that are supported by the system. These propagating modes do not have an equivalent in conventional dielectrics. As each of these waves can be thermally excited, a hyperbolic metamaterial will therefore show a dramatic enhancement in the radiative transfer rates (i.e. transfer of energy in the form of electromagnetic radiation). This mechanism results in an infinite value of the density of states for every frequency where different components of the dielectric permittivity have opposite signs. The unit cell size in the metamaterials runs from approximately 10 nm (for semiconductor and metal-dielectric layered structures) to approximately 100 nm (for nanowire composites), and also depends on the fabrication method used.

Figure 4:
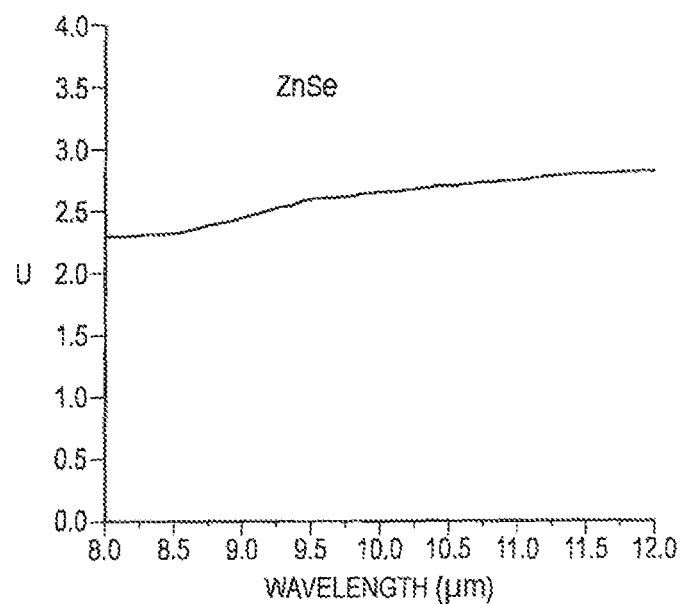
FIG. 4 shows the positive dielectric function of ZnSe as a function of wavelength.
Figure 5:
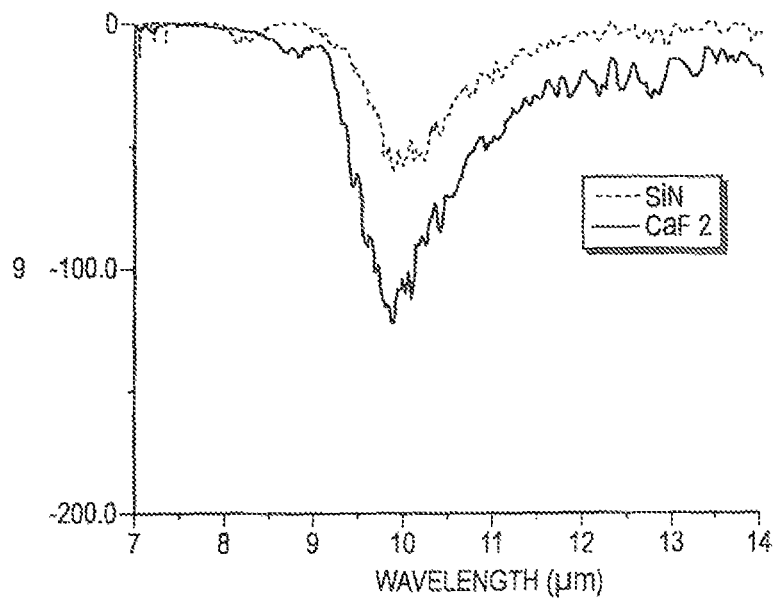
FIG. 5 shows the negative dielectric function of SiN and $CaF_2$ as a function of wavelength.

The materials selected for the dual DBR/heat spreader structure should meet the requirement of the metamaterial structure (materials with positive and negative dielectric constant in the LWIR), but also the requirements of the DBR for the VCSEL device (materials transparent at the emission wavelength of the VCSEL). As seen in FIG. 4, ZnSe is a favorable optical material in the LWIR range, which means that it has a positive dielectric constant $\in$. FIG. 4 illustrates the dielectric function as a function of wavelength for ZnSe. As seen in FIG. 5, $CaF_2$ is a favorable broadband having a negative $\in$ material in the LWIR due to the Reststrahlen effect. That is, the dielectric constant is less than zero and is seen as a function of wavelength in FIG. 5.

Using different materials, the same approach can be applied to form a DBR and heat spreader structures that are tuned for VCSEL emitting at other wavelengths such as 808 nm or 880 nm. Preliminary electromagnetic simulations verify the propagation of LWIR photons through this structure in the form of coupled surface waves, which live on the positive and negative interfaces. A preliminary calculation of the thermal conductivity of the structure is given by the following formula:

$$K = \frac{1}{3}C_V cL = \frac{1}{3}\left(\frac{\partial u_{hyp}}{\partial T}\right)cL = \frac{ck^2 K_{max}^3 C^*(\omega)LT}{108h} \approx 27 \frac{W}{cmK}$$

Wherein:
$K_{max}$ is defined by the metamaterial structure scale: $K_{max} \sim 2\pi/\langle d \rangle$, where $\langle d \rangle$ is the average layer thickness (42 nm in the above equation);

$C^* \sim \lambda/2\pi c$, where $\lambda \sim 10$ μm;
L is the free propagation length of photons (~100 μm);
T is the temperature.

For this architecture, the projected average conductivity is more than 100 times larger than a conventional DBR structure and nearly the same as that of diamond. However, unlike diamond, the projected thermal conductivity of metamaterial increases with temperature. Additionally, the thermal conductivity is temperature dependent. That is, it will increase with the temperature of the device, thereby allowing the VCSEL to operate at higher temperature and/or in high ambient temperature environment. This enhancement of thermal conductivity greatly improves the performance of the VCSEL. First, the output power of the VCSEL is proportional to the square root of the thermal impedance distanced away from the threshold. Thus, if the thermal conductivity of the DBR improves 100-fold, the output power should improve~10-fold. With this improvement, VCSEL arrays would prove far superior to laser diodes regarding the efficiency, brightness, reliability, and operating temperature in a laser pumping application. In addition, for a solid state laser pumped by this type of VCSEL array, numerous benefits are expected depending on the laser operation. Moreover, new concepts that reduce cost, weight, and complexity while improving efficiency and reliability can be readily envisioned. Also, as wall-plug efficiency rises, significant savings in size and weight can be achieved due to reduction in the required logistic equipment needed to operate the laser, particularly power supply and the cooling system.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method of improving heat dissipation and thermal management in a microelectronic device comprising the step of replacing a conventional distributed Bragg reflector (DBR) with a layered hyperbolic metamaterial in said microelectronic device.

2. The method of claim 1 wherein said microelectronic device is a vertical cavity surface emitting laser (VCSEL) device.

3. The method of claim 1 wherein the layered hyperbolic metamaterial acts as a DBR in the visible range, while having broadband hyperbolic behavior in the long-wave infrared range.

4. The method of claim 3 wherein the layered hyperbolic metamaterial comprises alternating layers of at least a first material and a second material.

5. The method of claim 4 wherein said first material is ZnSe.

6. The method of claim 4 wherein said second material is $CaF_2$.

7. The method of claim 4 wherein said layers are less than 10μm.

* * * * *